US011287551B2

(12) United States Patent
Yang et al.

(10) Patent No.: US 11,287,551 B2
(45) Date of Patent: Mar. 29, 2022

(54) METHOD OF FORMING NANO-PATTERNS ON A SUBSTRATE

(71) Applicant: AGENCY FOR SCIENCE, TECHNOLOGY AND RESEARCH, Singapore (SG)

(72) Inventors: Kwang Wei Joel Yang, Singapore (SG); Zhaogang Dong, Singapore (SG); Ramon Paniagua-Dominguez, Singapore (SG); Arseniy Kuznetsov, Singapore (SG); Yefeng Yu, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 314 days.

(21) Appl. No.: 16/330,764

(22) PCT Filed: Sep. 5, 2017

(86) PCT No.: PCT/SG2017/050440
§ 371 (c)(1),
(2) Date: Mar. 5, 2019

(87) PCT Pub. No.: WO2018/044240
PCT Pub. Date: Mar. 8, 2018

(65) Prior Publication Data
US 2019/0187337 A1    Jun. 20, 2019

(30) Foreign Application Priority Data

Sep. 5, 2016   (SG) ............................ 10201607372X

(51) Int. Cl.
*G02B 1/10* (2015.01)
*G02B 1/118* (2015.01)
(Continued)

(52) U.S. Cl.
CPC .......... *G02B 1/118* (2013.01); *B81C 1/00031* (2013.01); *B81C 1/00388* (2013.01);
(Continued)

(58) Field of Classification Search
CPC ... G02B 1/00; G02B 1/10; G02B 1/11; G02B 1/111; G02B 1/113; G02B 1/118;
(Continued)

(56) References Cited

U.S. PATENT DOCUMENTS

| 7,170,666 B2 * | 1/2007 | Piehl ...................... B82Y 20/00 |
| | | 359/237 |
| 2012/0105853 A1 * | 5/2012 | Pang ..................... G01N 21/554 |
| | | 356/445 |

(Continued)

FOREIGN PATENT DOCUMENTS

| CN | 101093867 A | 12/2007 |
| WO | 2014205238 A1 | 12/2014 |

OTHER PUBLICATIONS

Cao, et al., "Tuning the Color of Silicon Nanostructures," Nano Letters, May 27, 2010, pp. 2649-2654, vol. 10, American Chemical Society.

(Continued)

*Primary Examiner* — Thong Q Nguyen
(74) *Attorney, Agent, or Firm* — Womble Bond Dickinson (US) LLP

(57) ABSTRACT

This application relates to a method of forming nano-patterns on a substrate comprising the step of forming a plurality of nanostructures on a dielectric substrate, wherein the nanostructures are dimensioned or spaced apart from each other by a scaling factor of the dielectric substrate with reference to a silicon substrate.

18 Claims, 8 Drawing Sheets

(51) Int. Cl.
| | |
|---|---|
| *B82Y 40/00* | (2011.01) |
| *B81C 1/00* | (2006.01) |
| *G02B 1/115* | (2015.01) |
| *G03F 7/00* | (2006.01) |
| *H01L 21/027* | (2006.01) |
| *H01L 21/033* | (2006.01) |
| *H01L 21/311* | (2006.01) |

(52) U.S. Cl.
CPC ............ *B82Y 40/00* (2013.01); *G02B 1/115* (2013.01); *G03F 7/0002* (2013.01); *H01L 21/0271* (2013.01); *H01L 21/0337* (2013.01); *H01L 21/31144* (2013.01); *B81C 2201/0149* (2013.01)

(58) Field of Classification Search
CPC . G02B 1/115; B82C 1/00031; B82C 1/00388; B82Y 40/00; H01L 21/0271; H01L 21/0337; H01L 21/31144
USPC ................ 359/515–553, 599–614, 577–590
See application file for complete search history.

(56) References Cited

U.S. PATENT DOCUMENTS

| | | |
|---|---|---|
| 2013/0194669 A1 | 8/2013 | De Waele et al. |
| 2014/0287587 A1 | 9/2014 | Lee et al. |
| 2014/0295669 A1 | 10/2014 | Kawanishi et al. |
| 2015/0233822 A1 | 8/2015 | Sugimoto et al. |
| 2015/0309214 A1* | 10/2015 | Schulz .............. H01J 37/32366 428/142 |
| 2015/0377815 A1* | 12/2015 | Wiklof ................. G01N 27/221 324/446 |
| 2016/0139302 A1* | 5/2016 | Black ................... G03F 7/0002 428/141 |
| 2016/0322517 A1* | 11/2016 | Narasimhan ...... H01L 31/02366 |

OTHER PUBLICATIONS

Cao, et al., "Optical Coupling of Deep-Subwavelength Semiconductor Nanowires," Nano Letters, Mar. 28, 2011, pp. 1463-1468, vol. 11, American Chemical Society.

Dong, et al., "Second-Harmonic Generation from Sub-5 nm Gaps by Directed Self-Assembly of Nanoparticles onto Template-Stripped Gold Substrates," Nano Letters, Aug. 13, 2015, pp. 5976-5981, vol. 15, American Chemical Society.

Kumar, et al., "Printing colour at the optical diffraction limit," Nature Nanotechnology, Sep. 2012, pp. 557-561, vol. 7, Macmillan Publishers Limited.

Park, et al., "Adding colors to polydimethylsiloxane by embedding vertical silicon nanowires," Applied Physics Letters, 2012, 5 pgs., vol. 101, American Institute of Physics.

Park, et al., "Multispectral imaging with vertical silicon nanowires," Scientific Reports, Aug. 19, 2013, 6 pgs., vol. 3.

Radescu, et al., "Exact calculation of the angular momentum loss, recoil force, and radiation intensity for an arbitrary source in terms of electric, magnetic, and toroid multipoles," Physical Review E, Apr. 1, 2002, 47 pgs., vol. 65, The American Physical Society.

Seo, et al., "Multicolored Vertical Silicon Nanowires," Nano Letters, Mar. 17, 2011, pp. 1851-1856, vol. 11.

International Search Report and the Written Opinion of the International Searching Authority for International Application No. PCT/SG2017/050440 dated Nov. 9, 2017.

* cited by examiner

[Fig. 1]
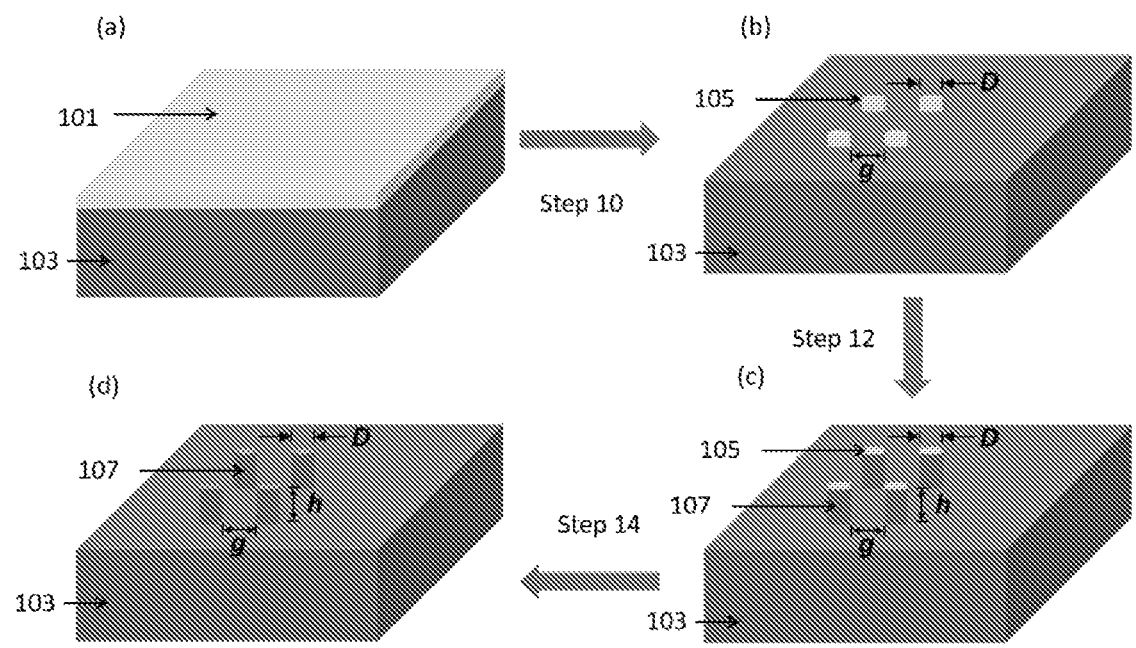

[Fig. 2]
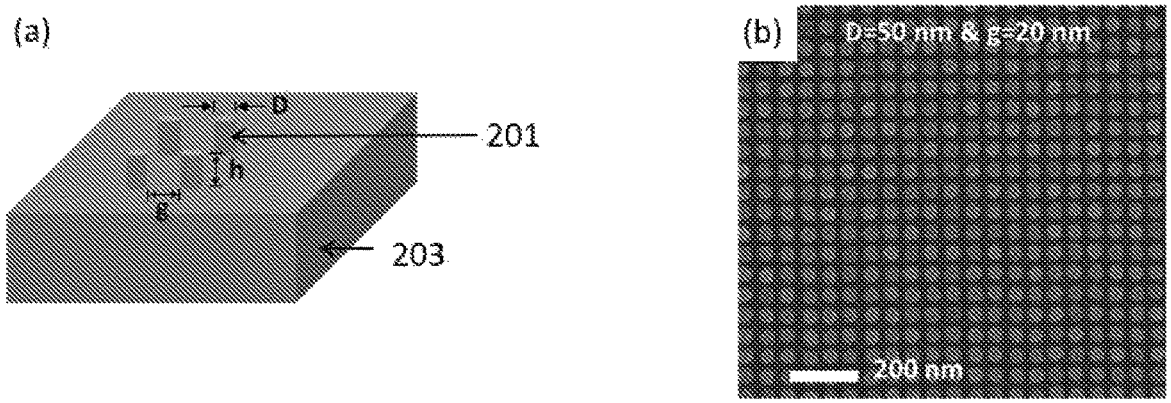

[Fig. 3]
(a)
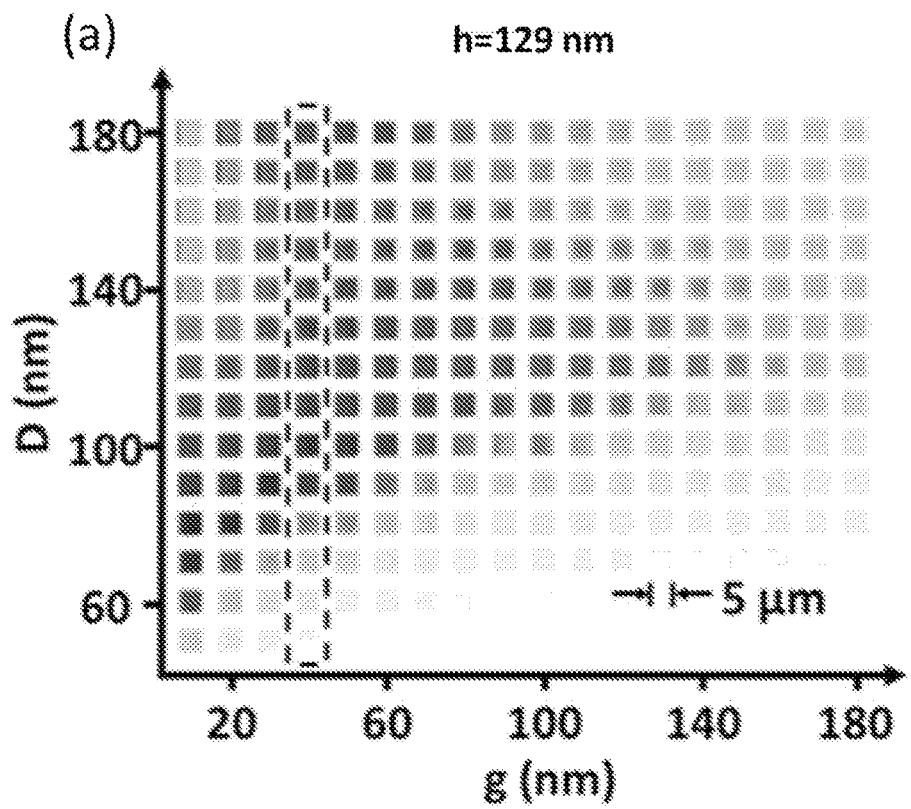
(b)
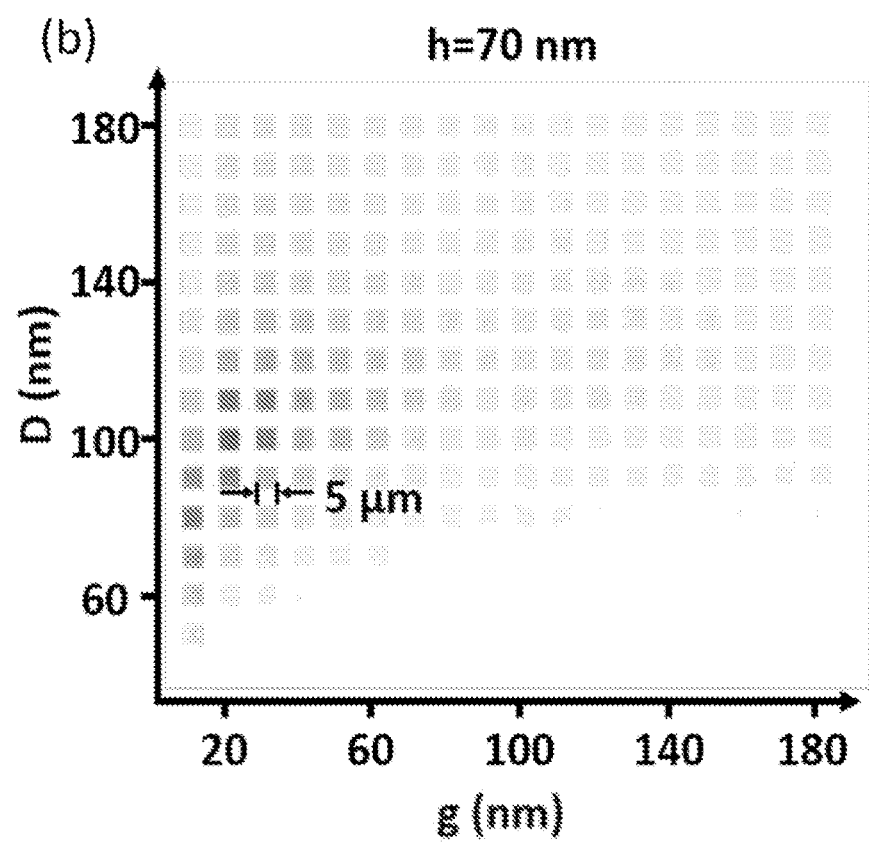

[Fig. 4]
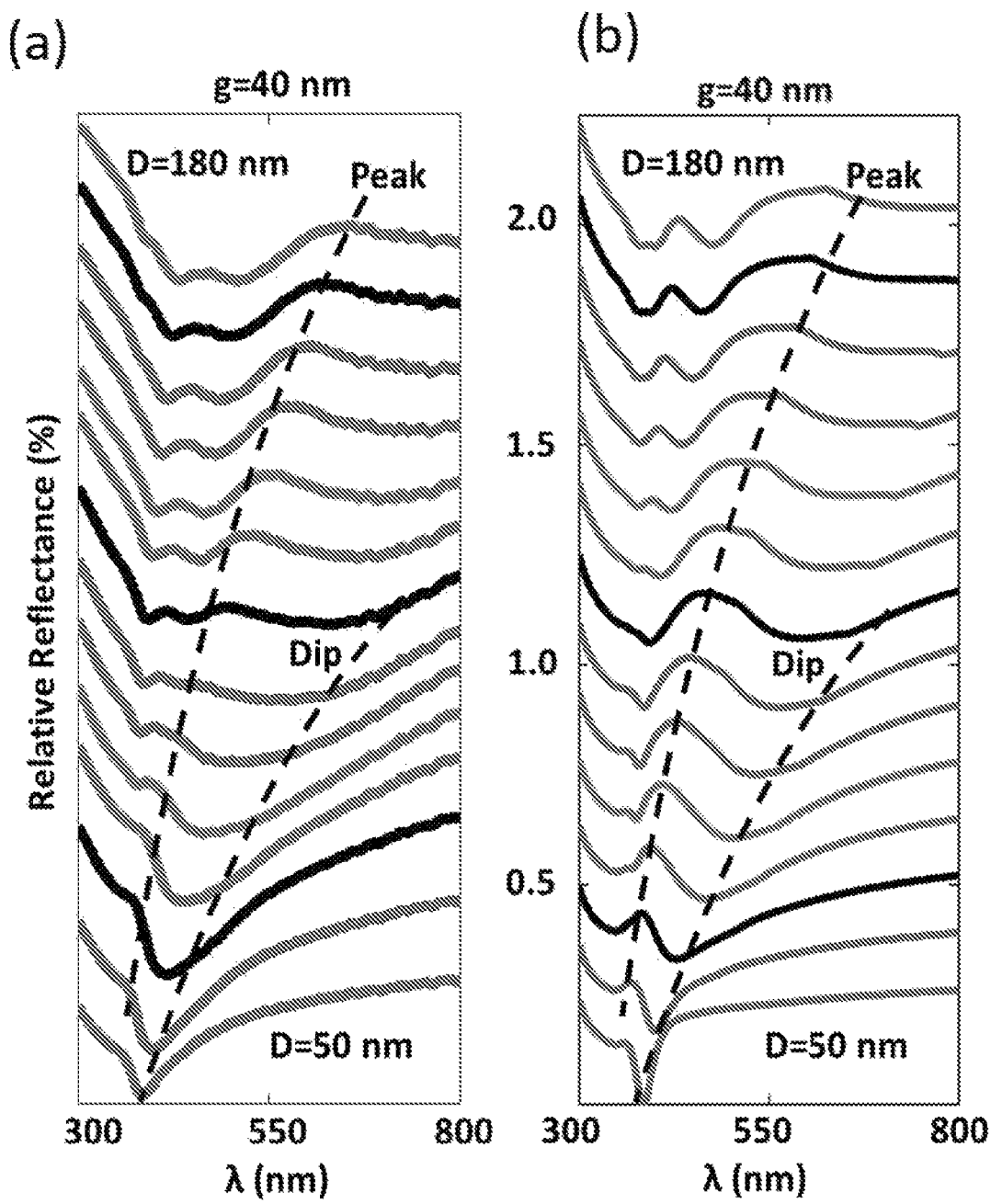

[Fig. 5]
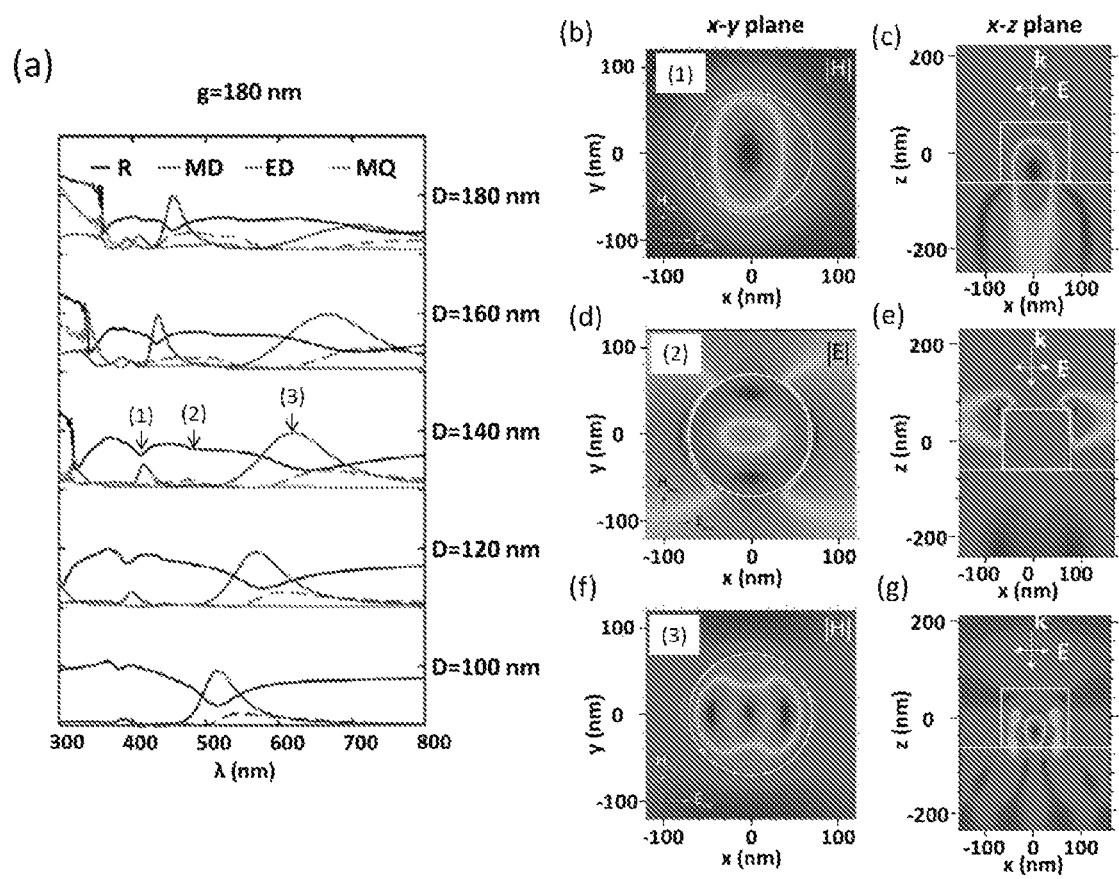

[Fig. 6]
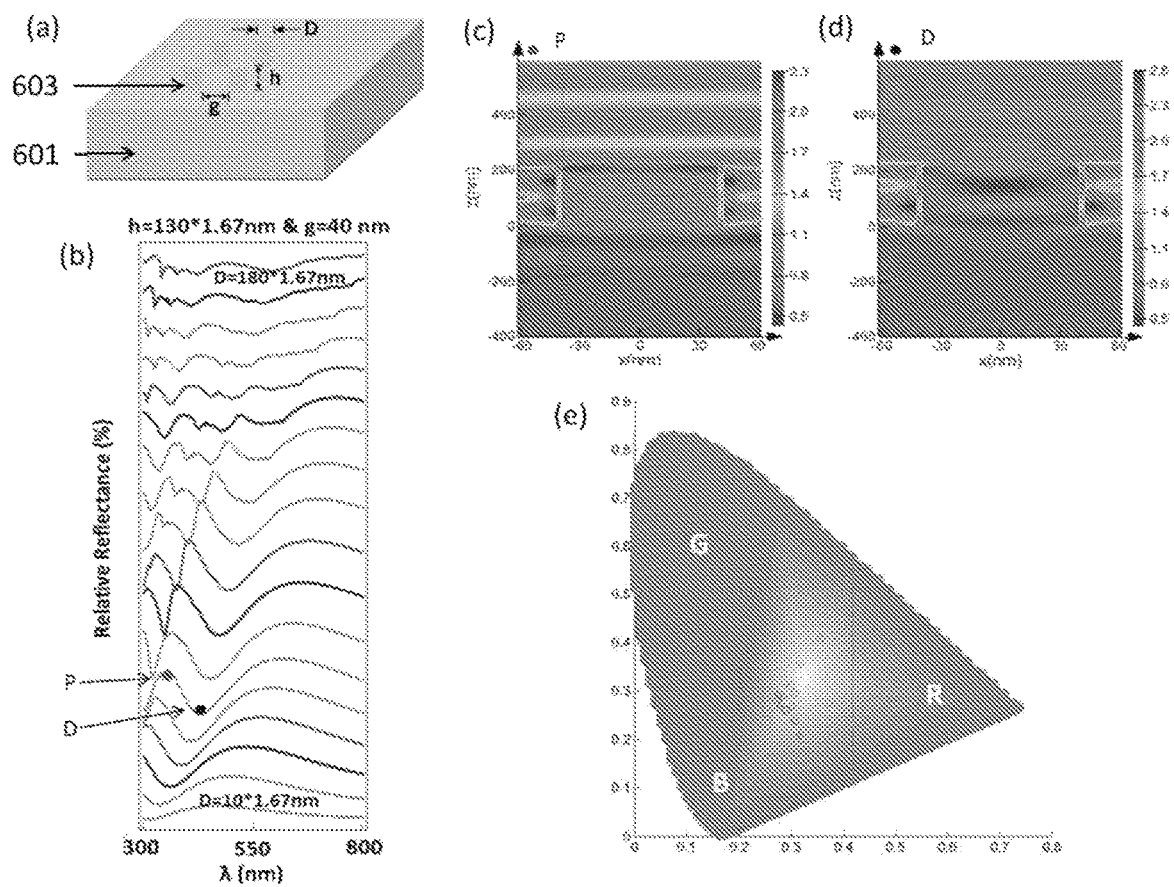

[Fig. 7]
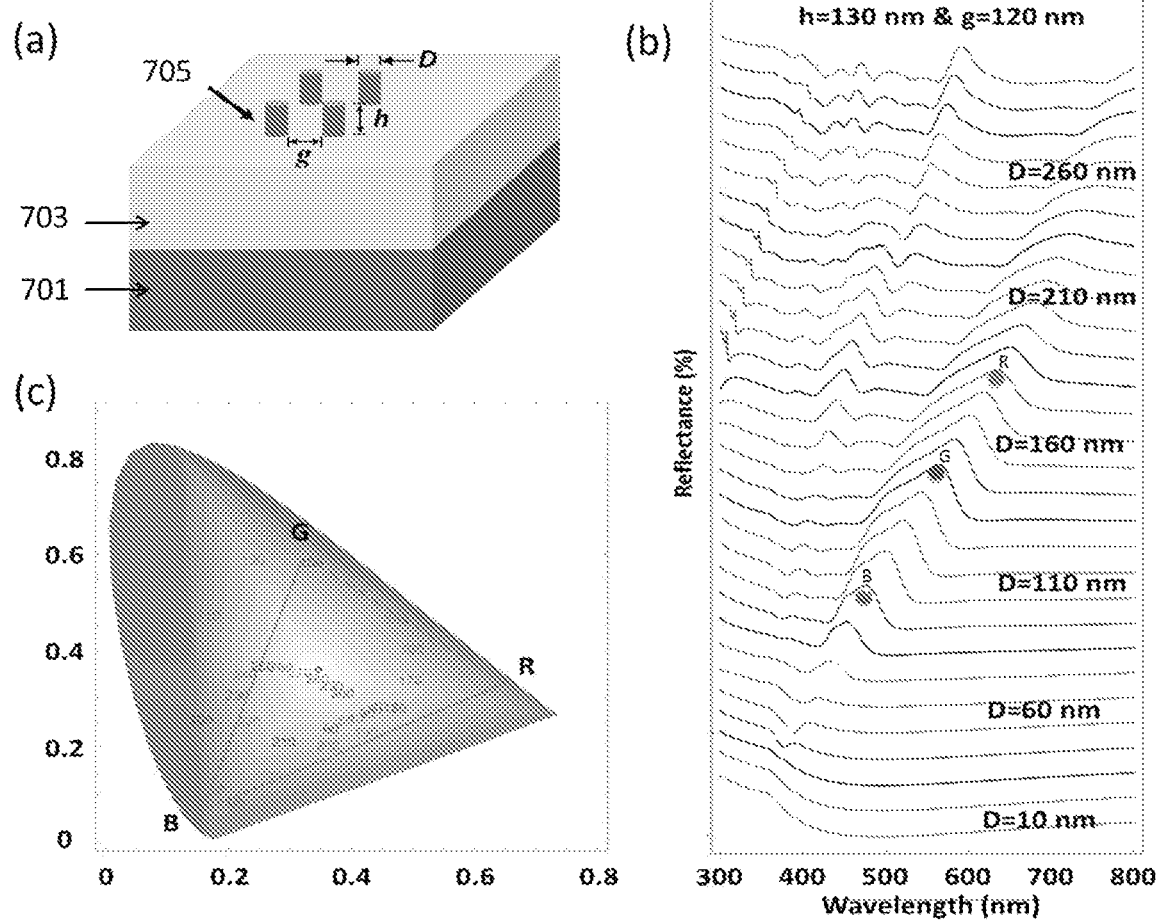

[Fig. 8]
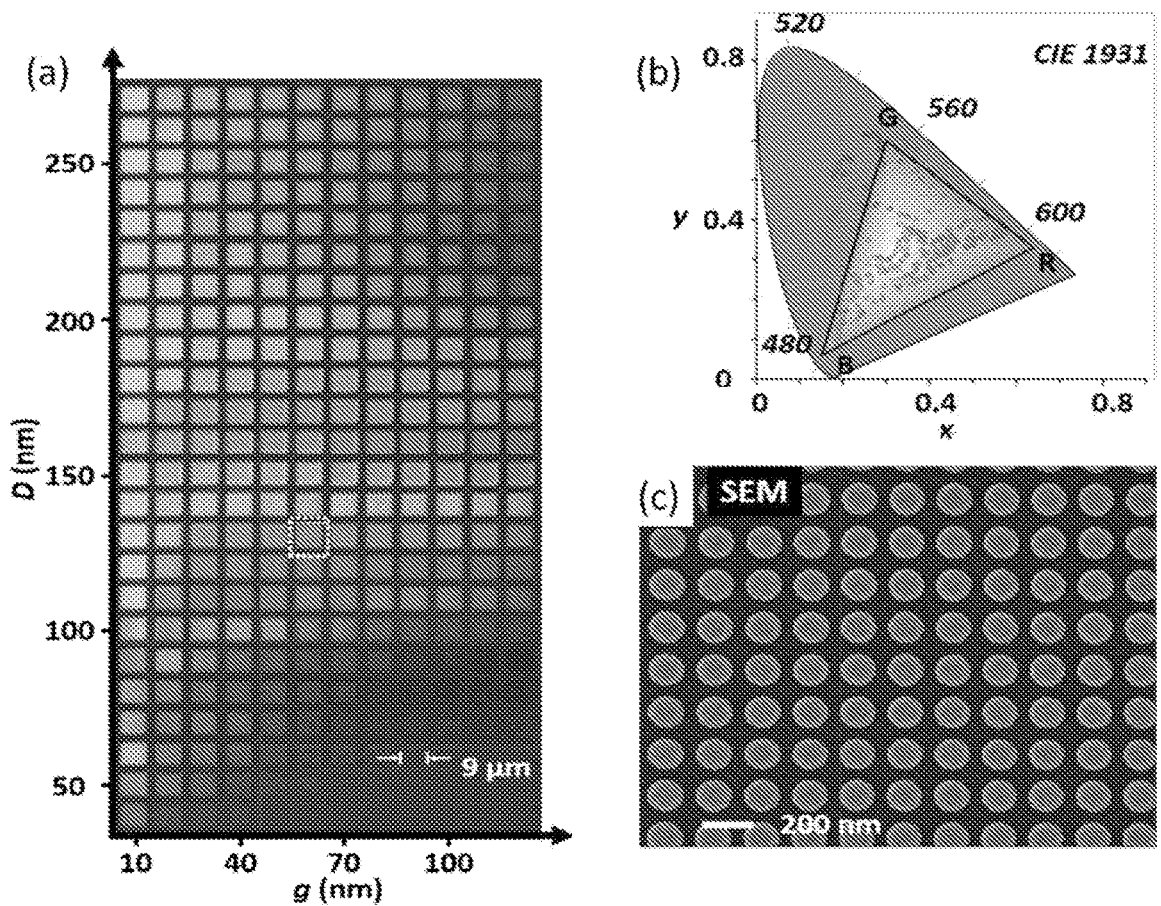

METHOD OF FORMING NANO-PATTERNS ON A SUBSTRATE

CROSS-REFERENCE TO RELATED APPLICATIONS

This patent application is a U.S. National Phase Application Under 35 U.S.C § 371 of International Application No. PCT/SG2017/050440, filed on Sep. 5, 2017, entitled "A METHOD OF FORMING NANO-PATTERNS ON A SUBSTRATE," which claims the benefit of priority of Singapore Patent Application No. 10201607372X, filed on Sep. 5, 2016.

TECHNICAL FIELD

The present invention generally relates to a method of forming nano-patterns on a substrate. The present invention also relates to a nano-patterned substrate formed by the method disclosed herein.

BACKGROUND ART

High-resolution colour printing beyond the optical diffraction limit has attracted a great deal of attention in recent years due to its promising applications in the field of Optics. Conventionally, high-resolution colour printing is enabled by the localized plasmon resonance of metallic nanostructures, where each basic colour pixel consisted of metal/HSQ (hydrogen silsesquioxane) nanodisks placed on top of the substrate. However, there exists one key challenge for the conventional high-resolution colour printing technique relying on plasmonic nanostructures. The conventional fabrication process employed in plasmonic colour printing technique used metals such as gold (Au), silver (Ag) and Aluminium (Al), which were not complementary metal-oxide semiconductor (CMOS) compatible. As noble metals such as gold could diffuse into silicon, these metals were not allowed in industrial semi-conductor fabrication facilities. Further, although aluminium was CMOS compatible, it produced colours that are less vibrant than that of silver and gold.

At present, single or double silicon nanowires with typical dimensions in the micrometer (μm) range had been fabricated in order to produce colour under dark-field optical microscope, which was due to the excitation and optical coupling of geometrical resonances (Mie resonance). However, such lateral dimensions imposed certain structural limits to the nanowires for high-resolution colour printing beyond the optical diffraction limit. Moreover, an array of vertical silicon nanowires with a typical length of 1 μm and a pitch size of 1 μm had been used to demonstrate colour display in bright optical microscope. A structural colour arose due to the mode-induced absorption of the associated visible light wavelength. These absorption peaks, however, were present at a typical full-width-half-maximum (FWHM) of more than 100 nm, which limited the quality of the colours obtained. Moreover, pitch sizes of 1 μm would limit the number of applications of these long vertical silicon nanowires for achieving colour display that was beyond the diffraction limit. Furthermore, tall nanostructures were highly difficult to fabricate and maintain. Therefore, the above dimensions for silicon nanostructures were unsuitable for use.

There is a need to provide a method to form nanopatterns on a substrate that overcomes, or at least ameliorates, one or more of the disadvantages described above.

SUMMARY OF INVENTION

According to a first aspect, there is provided a method of forming a nano-patterned substrate comprising the step of forming a plurality of nanostructures on a dielectric substrate, wherein the nanostructures are dimensioned or spaced apart from each other by a scaling factor of the dielectric substrate with reference to a silicon substrate.

According to a second aspect, there is provided a method of forming a nano-patterned substrate comprising the step of forming a plurality of nanostructures on a dielectric substrate, wherein said dielectric substrate comprises an anti-reflectance layer disposed on a base substrate.

According to a third aspect, there is provided a method of forming a nano-patterned substrate comprising the steps of forming a plurality of nanostructures on a dielectric substrate, wherein the dielectric substrate comprises an anti-reflectance layer disposed on a base substrate, wherein the nanostructures comprise a dielectric material, and wherein the nanostructures are dimensioned or spaced apart from each other by a scaling factor of the dielectric material with reference to a silicon substrate.

According to a fourth aspect, there is provided a nano-patterned substrate produced by the method as described herein.

Advantageously, the dielectric materials used in the dielectric substrate may have significantly lower Ohmic/resistive loss as compared to the use of noble metals such as gold and silver. More advantageously, the dielectric materials of the present disclosure may be CMOS process compatible. Therefore, the dielectric nanostructures of the present disclosure may be capable of producing high-resolution colour pixels with surprisingly vivid colour display, as compared to the corresponding metallic approach using localized plasmon resonances.

Advantageously, the addition of an anti-reflectance layer (as shown in the second aspect) may minimize the background optical signal. As a result, the anti-reflectance layer may enhance the colour fidelity significantly in a chromaticity diagram as standardized by the *Comission Internationale de l'Eclairage* (International Commission on Illumination) (also known as the CIE 1931 chromaticity diagram). More advantageously, the addition of an anti-reflectance layer may achieve superior colour saturation beyond the optical diffraction limit.

Definitions

The following words and terms used herein shall have the meaning indicated:

The term "dielectric" or "dielectric material" as used herein refers to a material that is a poor conductor of electricity but has a high polarizability in an electrostatic field. The ability of a dielectric material to store electrical energy in an electric field is measured by its dielectric constant. The term "dielectric" as defined herein does not include silicon as a possible dielectric material.

The term "subtractive colour" as used herein refers to colours created by a subtractive colour system wherein the mixing of colours moves the colour scale from white to black. In the subtractive colour system, the addition of a colour results in the subtracting or absorbing of certain wavelengths of the visible light spectrum. The colour that is displayed would be the part of the visible light spectrum that is not absorbed, and therefore remain visible to a human eye.

The term "additive colour" as used herein refers to colours created by an additive colour system wherein the mixing of colours moves the colour scale from black to white. In the additive colour system, light sources of various wavelengths are added to create a wider range of colours.

The term "nanostructure" as used herein refers to geometrical structures with at least one dimension in the nanometer (nm) range and is to be interpreted broadly to include different shapes and sizes. The nanometer range is about 1 nm to about 1000 nm, about 1 nm to about 500 nm, about 1 nm to about 200 nm or about 1 nm to about 100 nm.

The term "reflectance" as used herein refers to the percentage of light at normal incidence that is reflected back to the observer from the surface of the dielectric substrate at a particular visible light wavelength.

The term "relative reflectance" as used herein refers to the reflectance of light on patterned dielectric substrate with reference to the reflectance of light on a flat (that is, not patterned) dielectric substrate.

The word "substantially" does not exclude "completely" e.g. a composition which is "substantially free" from Y may be completely free from Y. Where necessary, the word "substantially" may be omitted from the definition of the invention.

Unless specified otherwise, the terms "comprising" and "comprise", and grammatical variants thereof, are intended to represent "open" or "inclusive" language such that they include recited elements but also permit inclusion of additional, unrecited elements.

As used herein, the term "about", in the context of concentrations of components of the formulations, typically means +/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Certain embodiments may also be described broadly and generically herein. Each of the narrower species and sub-generic groupings falling within the generic disclosure also form part of the disclosure. This includes the generic description of the embodiments with a proviso or negative limitation removing any subject matter from the genus, regardless of whether or not the excised material is specifically recited herein.

DETAILED DISCLOSURE OF EMBODIMENTS

Exemplary, non-limiting embodiments of the method of forming a nano-patterned substrate will now be disclosed.

The method of forming a nano-patterned substrate may comprise the step of forming a plurality of nanostructures on a dielectric substrate, wherein the nanostructures are dimensioned or spaced apart from each other by a scaling factor of the dielectric substrate with reference to a silicon substrate.

The scaling factor may be a ratio of a refractive index of the silicon to a refractive index of the dielectric substrate. The scaling factor may be a refractive index ratio represented by an expression $n_{si}/n_{dielectric}$, where $n_{si}$ is the refractive index of the referenced silicon substrate and $n_{dielectric}$ is the refractive index of the selected dielectric substrate. The scaling factor may have a value that is not equal to 1.

The scaling factor (denoted here by s) may be used as a multiplicative factor to determine the dimension(s) or inter-structure spacing value of the plurality of nanostructures as compared to silicon nanostructures. For example, where cylindrical-shaped silicon nanostructures are formed on a silicon substrate having dimensions of x diameter and z height with an inter-structure spacing of v, the plurality of nanostructures on the dielectric substrate will then have dimensions of (s×x) diameter and (s×z) height with an inter-structure spacing of (s×v). Other dimension(s) that are not mentioned here for other shapes of nanostructures can also be used on the dielectric substrate by multiplying the corresponding dimension(s) on silicon nanostructures by the scaling factor s as exemplified above.

The nanostructures may be fabricated by nanoimprint lithography, wet etching, dry etching, anisotrophic wet etching, plasma etching, electro-beam lithography, focused ion-beam lithography, nanosphere lithography, dip-pen nano-lithography, soft lithography, chemical, electrochemical or photochemical means, or the like.

The nanostructures may be integrally formed on the dielectric substrate. This means that the nanostructures are formed at the same time of forming the dielectric substrate, such that no additional etching or imprinting steps are required to form the nanostructures on the substrate. Alternatively, the nanostructure may not be integrally formed on the dielectric substrate. This means that additional etching or imprinting steps are required to form the nanostructures on the surface of the dielectric substrate.

The nanostructures formed may not be integral with the dielectric substrate. The nanostructures may be added to the surface of the dielectric substrate as a separate layer.

The nanostructures may have uniform or non-uniform dimensions. The nanostructures may be uniformly spaced apart or non-uniformly spaced apart on the surface of the dielectric substrate.

The surface of the dielectric substrate may comprise a plurality of protrusions, recessions, dimples or any combinations thereof. Hence, the nanostructures may comprise a plurality of protrusions, recessions, dimples or any combinations thereof.

The dimension and/or position of the nanostructures may comprise lateral dimensions, vertical dimensions, inter-structure distance or any combinations thereof.

The lateral dimensions may be any dimensions measured in the x-y plane. The lateral dimensions may comprise length, breadth, width, diameter, radius, hypotenuse, or any combinations thereof.

The vertical dimensions may be measured in the z plane, such as height.

The inter-structure distance may be a distance measured between each nanostructure. The inter-structure distance may be a pitch size, or a gap size between two nanostructures. The pitch or gap size may be regarded as the distance between the central axes of a pair of nanostructures. The pitch or gap size may alternatively refer to the surface to surface distance between the pair of nanostructures.

The nanostructure may have a geometrical shape selected from the group consisting of disks, tubes, wires, columns, cylinders, spherical, cubical, tetrahedral, octahedral, pyramidal, conical, rings, and rectangular prisms.

The dielectric substrate may be selected based on its dielectric constant. The dielectric constant may have a value of about 1 to about 20, or about 1 to about 19, or about 1 to about 18, or about 1 to about 17, or about 1 to about 16, or about 1 to about 15, or about 1 to about 14, or about 1 to about 13, or about 1 to about 12, or about 1 to about 11, or about 1 to about 10, or about 1 to about 9, or about 1 to about 8, or about 1 to about 7, or about 1 to about 6, or about 1 to about 5, or about 1 to about 4, or about 1 to about 3, or about 1 to about 2, or about 2 to about 20, or about 3 to about 20, or about 4 to about 20, or about 5 to about 20, or about 6 to about 20, or about 7 to about 20, or about 8 to about 20, or about 9 to about 20, or about 10 to about 20, or about 11 to about 20, or about 12 to about 20, or about 12 to about 20, or about 13 to about 20, or about 14 to about 20, or about 15 to about 20, or about 16 to about 20, or about 17 to about 20, or about 18 to about 20, or about 19 to about 20.

The dielectric substrate may be selected from the group consisting of diamond, glass, polyethylene (PE), polyarylene ethers (PAE), parylene, Teflon, ceramics, mica, polycarbonate (PC), polymethylmethacrylate (PMMA), polyamides, polysiloxane, polypropylene (PP), polyvinyl chloride (PVC), polyethylene terephthalate (PET) or polydimethylsiloxane (PDMS), Titanium dioxide, Gallium Nitride, Titanium Nitride, Gallium Phosphide, and Germanium.

The dielectric substrate may be a semiconductor. The semiconductor may comprise a metal or its salt thereof, wherein the metal is selected from the group consisting of Germanium, Titanium, Indium, Gallium, Tin, Lead, Antimony, Bismuth, Lithium, Rubidium, Barium, Zirconium, Tungsten, and Tantalum. The semiconductor may comprise an anion selected from the group consisting of borides, carbides, nitrides, phosphides, sulphides, oxides, selenides, arsenides, tellurides, fluorides, chlorides, bromides, and iodides.

The dielectric substrate may comprise an anti-reflectance layer disposed on the surface of a base substrate. The anti-reflectance layer may be disposed onto the surface of the base substrate by chemical vapour deposition or by physical vapour deposition.

The anti-reflectance layer may be disposed onto the surface of the base substrate prior to the formation of nanostructures on the anti-reflectance layer. The anti-reflectance layer may be disposed onto the surface after the nanostructures have been formed on the base substrate. Hence, here, the dielectric substrate is defined to collectively refer to the base substrate having the anti-reflectance layer thereon. The base substrate used here is not particularly limited and may be any suitable substrate that can support the layering of the anti-reflectance layer. The base substrate may be a dielectric material as defined above, or may be silicon.

The anti-reflectance layer may have a reflective index determined by $\sqrt{n_{air} n_{sub}}$, wherein $n_{air}$ is the reflective index of air and $n_{sub}$ is the reflective index of the base substrate.

The material of the anti-reflectance layer may comprise a salt. The salt may be an inorganic salt. The salt may comprise an anion selected from the group consisting of nitrides, oxides, carbides, borides, fluorides, chlorides, bromides, iodides, phosphides, sulphides, silicates, selenides, arsenides, tellurides, borates, nitrates, carbonates, phosphates, sulphates, and chlorate. The salt may be a silicon salt and may be silicon nitrides, silicon oxides, silicon carbides, silicon borides, silicon fluorides, silicon chlorides, silicon bromides, silicon iodides, silicon phosphides, silicon sulphides, silicon selenides, silicon arsenides, and silicon tellurides.

The thickness of the anti-reflectance layer may be about 50 nm to about 100 nm, or about 50 nm to about 95 nm, or about 50 nm to about 90 nm, or about 50 nm to about 85 nm, or about 50 nm to about 80 nm, or about 50 nm to about 75 nm, or about 50 nm to about 70 nm, or about 50 nm to about 65 nm, or about 50 nm to about 60 nm, or about 50 nm to about 55 nm, or about 55 nm to about 100 nm, or about 60 nm to about 100 nm, or about 65 nm to about 100 nm, or about 70 nm to about 100 nm, or about 75 nm to about 100 nm, or about 80 nm to about 100 nm, or about 85 nm to about 100 nm, or about 90 nm to about 100 nm, or about 95 nm to about 100 nm.

The nanostructure may be a dielectric material. The nanostructure may be a material that is the same as or different from the dielectric material making up the dielectric substrate. In embodiments where the anti-reflectance layer is present, the nanostructure may be a dielectric material that is the same as or different from the base substrate material or anti-reflectance material. Where the nanostructure material is different from the base substrate material or anti-reflectance material, the scaling factor may refer to the ratio of the refractive index of the silicon to the refractive index of the dielectric material of the nanostructure.

The nanostructure may be a nanodisk. The nanodisk may have a diameter of about 10 nm to about 320 nm, or about 10 nm to about 300 nm, or about 10 nm to about 280 nm, or about 10 nm to about 260 nm, or about 10 nm to about 240 nm, or about 10 nm to about 220 nm, or about 10 nm to about 200 nm, or about 10 nm to about 180 nm, or about 10 nm to about 160 nm, or about 10 nm to about 140 nm, or about 10 nm to about 120 nm, or about 10 nm to about 100 nm, or about 10 nm to about 80 nm, or about 10 nm to about 60 nm, or about 10 nm to about 40 nm, or about 10 nm to about 20 nm, or about 30 nm to about 320 nm, or about 50 nm to about 320 nm, or about 70 nm to about 320 nm, or about 90 nm to about 320 nm, or about 110 nm to about 320 nm, or about 130 nm to about 320 nm, or about 150 nm to about 320 nm, or about 170 nm to about 320 nm, or about 190 nm to about 320 nm, or about 210 nm to about 320 nm, or about 230 nm to about 320 nm, or about 250 nm to about 320 nm, or about 270 nm to about 320 nm, or about 290 nm to about 320 nm, or about 310 nm to about 320 nm, or about 20 nm to about 260 nm, or about 40 nm to about 260 nm, or about 60 nm to about 260 nm, or about 80 nm to about 260 nm, or about 100 nm to about 260 nm, or about 120 nm to about 260 nm, or about 140 nm to about 260 nm, or about 160 nm to about 260 nm, or about 180 nm to about 260 nm, or about 200 nm to about 260 nm, or about 220 nm to about 260 nm, or about 240 nm to about 260 nm, or about 50 nm to about 180 nm, or about 50 nm to about 160 nm, or about 50 nm to about 140 nm, or about 50 nm to about 120 nm, or about 50 nm to about 100 nm, or about 50 nm to about 80 nm, or about 50 nm to about 60 nm, or about 60 nm to about 180 nm, or about 80 nm to about 180 nm, or about or about 100 nm to about 180 nm, or about 120 nm to about 180 nm, or about 140 nm to about 180 nm, or about 160 nm to about 180 nm.

The nanodisk may have a height of about 160 nm to about 260 nm, or about 160 nm to about 240 nm, or about 160 nm to about 220 nm, or about 160 nm to about 200 nm, or about 160 nm to about 180 nm, or about 180 nm to about 260 nm, or about 200 nm to about 260 nm, or about 220 nm to about 260 nm, or about 240 nm to about 260 nm, or about 110 nm to about 150 nm, or about 120 nm to about 150 nm, or about 130 nm to about 150 nm, or about 140 nm to about 150 nm, or about 110 nm to about 140 nm, or about 110 nm to about 130 nm, or about 110 nm to about 120 nm, or about 120 nm to about 130 nm.

The nanodisk may have an inter-structure distance (pitch or gap size) of about 10 nm to about 180 nm, or 10 nm to about 160 nm, or 10 nm to about 140 nm, or 10 nm to about 120 nm, or 10 nm to about 100 nm, or 10 nm to about 80 nm, or 10 nm to about 60 nm, or 10 nm to about 40 nm, or 10 nm to about 20 nm, or 20 nm to about 180 nm, or 40 nm to about 180 nm, or 60 nm to about 180 nm, or 80 nm to about 180 nm, or 100 nm to about 180 nm, or 120 nm to about 180 nm, or 140 nm to about 180 nm, or 160 nm to about 180 nm.

The nanodisk may have a diameter of about 50 nm to about 180 nm, an inter-structure distance of about 10 nm to about 180 nm, and a height of about 129 nm.

The nanodisk may have a diameter of about 10 nm to about 260 nm, a height of about 130 nm and an inter-structure distance of about 120 nm.

The nanodisk may have diameter of about 16.7 nm to about 300.6 nm, height of about 217.1 nm and an inter-structure distance of about 40 nm.

Exemplary, non-limiting embodiments of another method of forming a nano-patterned substrate will now be disclosed.

The method of forming a nano-patterned substrate comprises the step of forming a plurality of nanostructures on a dielectric substrate, wherein the dielectric substrate comprises an anti-reflectance layer disposed on a base substrate.

The nanostructures may be fabricated by nanoimprint lithography, wet etching, dry etching, anisotrophic wet etching, plasma etching, electro-beam lithography, focused ion-beam lithography, nanosphere lithography, dip-pen nano-lithography, soft lithography, chemical, electrochemical or photochemical means, or the like.

The nanostructures may be integrally formed on the base substrate. This means that the nanostructures are formed at the same time of forming the base substrate, such that no additional etching or imprinting steps are required to form the nanostructures on the base substrate. Alternatively, the nanostructures may be integrally formed when forming the anti-reflectance layer on the base substrate.

The nanostructures formed may be integral with the anti-reflectance layer or disposed on the surface of the anti-reflectance layer as a separate layer. The anti-reflectance layer may be disposed onto the surface of the base substrate by chemical vapour deposition or by physical vapour deposition.

The nanostructures may have uniform or non-uniform dimensions. The nanostructures may be uniformly spaced apart or non-uniformly spaced apart on the surface of the dielectric substrate.

The surface of the dielectric substrate may comprise a plurality of protrusions, recessions, dimples or any combinations thereof. Hence, the nanostructures may comprise a plurality of protrusions, recessions, dimples or any combinations thereof.

The dimension and/or position of the nanostructures may comprise lateral dimensions, vertical dimensions, inter-structure distance or any combinations thereof.

The lateral dimensions may be any dimensions measured in the x-y plane. The lateral dimensions may comprise length, breadth, width, diameter, radius, hypotenuse, or any combinations thereof.

The vertical dimensions may be measured in the z plane, such as height.

The inter-structure distance may be a distance measured between each nanostructure. The inter-structure distance may be a pitch size, or a gap size between two nanostructures. The pitch or gap size may be regarded as the distance between the central axes of a pair of nanostructures. The pitch or gap size may alternatively refer to the surface to surface distance between the pair of nanostructures.

The nanostructure may have a geometrical shape selected from the group consisting of disks, tubes, wires, columns, cylinders, spherical, cubical, tetrahedral, octahedral, pyramidal, conical, rings, and rectangular prisms.

The anti-reflectance layer may be disposed onto the surface of the base substrate prior to the formation of nanostructures on the anti-reflectance layer. The anti-reflectance layer may be disposed onto the surface after the nanostructures have been formed on the base substrate. The base substrate used here is not particularly limited and may be any suitable substrate that can support the layering of the anti-reflectance layer. The base substrate may be a dielectric material as defined below, or may be silicon.

The anti-reflectance layer may have a reflective index determined by $\sqrt{n_{air}n_{sub}}$, wherein $n_{air}$ is the reflective index of air and $n_{sub}$ is the reflective index of the base substrate.

The material of the anti-reflectance layer may comprise a salt. The salt may be an inorganic salt. The salt may comprise an anion selected from the group consisting of nitrides, oxides, carbides, borides, fluorides, chlorides, bromides, iodides, phosphides, sulphides, silicates selenides, arsenides, tellurides, borates, nitrates, carbonates, phosphates, sulphates, and chlorate. The salt may be a silicon salt and may be silicon nitrides, silicon oxides, silicon carbides, silicon borides, silicon fluorides, silicon chlorides, silicon bromides, silicon iodides, silicon phosphides, silicon sulphides, silicon selenides, silicon arsenides, and silicon tellurides.

The thickness of the anti-reflectance layer may be about 50 nm to about 100 nm, or about 50 nm to about 95 nm, or about 50 nm to about 90 nm, or about 50 nm to about 85 nm, or about 50 nm to about 80 nm, or about 50 nm to about 75 nm, or about 50 nm to about 70 nm, or about 50 nm to about 65 nm, or about 50 nm to about 60 nm, or about 50 nm to about 55 nm, or about 55 nm to about 100 nm, or about 60 nm to about 100 nm, or about 65 nm to about 100 nm, or about 70 nm to about 100 nm, or about 75 nm to about 100 nm, or about 80 nm to about 100 nm, or about 85 nm to about 100 nm, or about 90 nm to about 100 nm, or about 95 nm to about 100 nm.

Where the base substrate is a dielectric material, the dielectric material may be selected based on its dielectric constant. The dielectric constant may have a value of about 1 to about 20, or about 1 to about 19, or about 1 to about 18, or about 1 to about 17, or about 1 to about 16, or about 1 to about 15, or about 1 to about 14, or about 1 to about 13, or about 1 to about 12, or about 1 to about 11, or about 1 to about 10, or about 1 to about 9, or about 1 to about 8, or about 1 to about 7, or about 1 to about 6, or about 1 to about 5, or about 1 to about 4, or about 1 to about 3, or about 1 to about 2, or about 2 to about 20, or about 3 to about 20, or about 4 to about 20, or about 5 to about 20, or about 6 to about 20, or about 7 to about 20, or about 8 to about 20, or about 9 to about 20, or about 10 to about 20, or about 11 to about 20, or about 12 to about 20, or about 13 to about 20, or about 14 to about 20, or about 15 to about 20, or about 16 to about 20, or about 17 to about 20, or about 18 to about 20, or about 19 to about 20.

The dielectric material may be selected from the group consisting of diamond, glass, polyethylene (PE), polyarylene ethers (PAE), parylene, Teflon, ceramics, mica, polycarbonate (PC), polymethylmethacrylate (PMMA), polyamides, polysiloxane, polypropylene (PP), polyvinyl chloride (PVC), polyethylene terephthalate (PET) or polydimethylsiloxane (PDMS), Titanium dioxide, Gallium Nitride, Titanium Nitride, Gallium Phosphide, and Germanium.

The dielectric substrate may be a semiconductor. The semiconductor may comprise a metal or its salt thereof, wherein the metal is selected from the group consisting of Germanium, Titanium, Indium, Gallium, Tin, Lead, Antimony, Bismuth, Lithium, Rubidium, Barium, Zirconium, Tungsten, and Tantalum. The semiconductor may comprise an anion selected from the group consisting of borides, carbides, nitrides, phosphides, sulphides, oxides, selenides, arsenides, tellurides, fluorides, chlorides, bromides, and iodides.

The nanostructure may be a dielectric material or may be silicon. The nanostructure may be a material that is the same as or different from the base substrate material or anti-reflectance material. Where the nanostructure material is different from the base substrate material or anti-reflectance material and the nanostructure is a dielectric material, the scaling factor may refer to the ratio of the refractive index of the silicon to the refractive index of the dielectric material of the nanostructure.

The nanostructure may be a nanodisk. The nanodisk may have a diameter of about 10 nm to about 320 nm, or about 10 nm to about 300 nm, or about 10 nm to about 280 nm, or about 10 nm to about 260 nm, or about 10 nm to about 240 nm, or about 10 nm to about 220 nm, or about 10 nm to about 200 nm, or about 10 nm to about 180 nm, or about 10 nm to about 160 nm, or about 10 nm to about 140 nm, or about 10 nm to about 120 nm, or about 10 nm to about 100 nm, or about 10 nm to about 80 nm, or about 10 nm to about 60 nm, or about 10 nm to about 40 nm, or about 10 nm to about 20 nm, or about 30 nm to about 320 nm, or about 50 nm to about 320 nm, or about 70 nm to about 320 nm, or about 90 nm to about 320 nm, or about 110 nm to about 320 nm, or about 130 nm to about 320 nm, or about 150 nm to about 320 nm, or about 170 nm to about 320 nm, or about 190 nm to about 320 nm, or about 210 nm to about 320 nm, or about 230 nm to about 320 nm, or about 250 nm to about 320 nm, or about 270 nm to about 320 nm, or about 290 nm to about 320 nm, or about 310 nm to about 320 nm, or about 20 nm to about 260 nm, or about 40 nm to about 260 nm, or about 60 nm to about 260 nm, or about 80 nm to about 260 nm, or about 100 nm to about 260 nm, or about 120 nm to about 260 nm, or about 140 nm to about 260 nm, or about 160 nm to about 260 nm, or about 180 nm to about 260 nm, or about 200 nm to about 260 nm, or about 220 nm to about 260 nm, or about 240 nm to about 260 nm, or about 50 nm to about 180 nm, or about 50 nm to about 160 nm, or about 50 nm to about 140 nm, or about 50 nm to about 120 nm, or about 50 nm to about 100 nm, or about 50 nm to about 80 nm, or about 50 nm to about 60 nm, or about 60 nm to about 180 nm, or about 80 nm to about 180 nm, or about or about 100 nm to about 180 nm, or about 120 nm to about 180 nm, or about 140 nm to about 180 nm, or about 160 nm to about 180 nm.

The nanodisk may have a height of about 160 nm to about 260 nm, or about 160 nm to about 240 nm, or about 160 nm to about 220 nm, or about 160 nm to about 200 nm, or about 160 nm to about 180 nm, or about 180 nm to about 260 nm, or about 200 nm to about 260 nm, or about 220 nm to about 260 nm, or about 240 nm to about 260 nm, or about 110 nm to about 150 nm, or about 120 nm to about 150 nm, or about 130 nm to about 150 nm, or about 140 nm to about 150 nm, or about 110 nm to about 140 nm, or about 110 nm to about 130 nm, or about 110 nm to about 120 nm, or about 120 nm to about 130 nm.

The nanodisk may have an inter-structure distance (pitch or gap size) of about 10 nm to about 180 nm, or 10 nm to about 160 nm, or 10 nm to about 140 nm, or 10 nm to about 120 nm, or 10 nm to about 100 nm, or 10 nm to about 80 nm, or 10 nm to about 60 nm, or 10 nm to about 40 nm, or 10 nm to about 20 nm, or 20 nm to about 180 nm, or 40 nm to about 180 nm, or 60 nm to about 180 nm, or 80 nm to about 180 nm, or 100 nm to about 180 nm, or 120 nm to about 180 nm, or 140 nm to about 180 nm, or 160 nm to about 180 nm.

The nanodisk may have a diameter of about 50 nm to about 180 nm, an inter-structure distance of about 10 nm to about 180 nm, and a height of about 129 nm.

The nanodisk may have a diameter of about 10 nm to about 260 nm, a height of about 130 nm and an inter-structure distance of about 120 nm.

The nanodisk may have diameter of about 16.7 nm to about 300.6 nm, height of about 217.1 nm and an inter-structure distance of about 40 nm.

There is also provided a method of forming a nano-patterned substrate comprising the steps of forming a plurality of nanostructures on a dielectric substrate, wherein the dielectric substrate comprises an anti-reflectance layer disposed on a base substrate, wherein the nanostructures comprise a dielectric material, and wherein the nanostructures are dimensioned or spaced apart from each other by a scaling factor of the dielectric material with reference to a silicon substrate.

The dielectric substrate is made up of the anti-reflectance layer and the base substrate. The anti-reflectance layer and base substrate may be as described above.

The dielectric material of the nanostructure may be the same as or different from the base substrate material or anti-reflectance material. Where the nanostructure material is different from the base substrate material or anti-reflectance material, the scaling factor may refer to the ratio of the refractive index of the silicon to the refractive index of the dielectric material of the nanostructure. Other characteristics of the nanostructure are as described above.

A nano-patterned surface may be produced by the method as described herein.

BRIEF DESCRIPTION OF DRAWINGS

The accompanying drawings illustrate a disclosed embodiment and serves to explain the principles of the disclosed embodiment. It is to be understood, however, that the drawings are designed for purposes of illustration only, and not as a definition of the limits of the invention.

FIG. 1 is a schematic diagram illustrating the process steps for forming nanodisks (107) on a substrate (103) as a reference material.

FIG. 2 is a diagram depicting the schematic illustration and the scanning electron micrograph (SEM) image of the fabricated silicon nanodisks (201) on a silicon substrate (203).

FIG. 3 is a bright-field optical microscope image of silicon nanodisks with various diameters and gap sizes at heights of 70 nm and 129 nm.

FIG. 4 is a diagram comparing the optical reflectance spectrum of silicon nanodisks having a gap size of 40 nm with the optical reflectance spectrum obtained from numerical simulations using the finite-difference-time-domain (FDTD) method.

FIG. 5 is a diagram depicting images from simulation of excited optical modes on the silicon nanodisks using the multi-pole decomposition method.

FIG. 6 is a diagram depicting the colour spectrum, optical distribution image and CIE chromaticity of diamond nanodisks (603) fabricated on a diamond substrate (601).

FIG. 7 is a diagram depicting the colour spectrum and CIE chromaticity after the addition of a silicon nitride anti-reflectance layer (703) to the silicon nanodisks (705) on a silicon substrate (701).

FIG. 8 is a diagram depicting the colour palette, CIE chromaticity and SEM image of silicon nanodisks after the addition of silicon nitride anti-reflectance layer to the silicon substrate.

DETAILED DESCRIPTION OF DRAWINGS

Referring to FIG. 1, there is shown a schematic illustration of the process of forming silicon nanodisks (107) on a substrate (103). As shown in FIG. 1(a), a resist layer is spin coated onto a substrate (103) to form a layer of negative electron-beam resist (101). The resist is subsequently subjected to electron beam lithography in step 10 to develop the nanodisk mask resists. As shown in FIG. 1(b), the developed nanodisk masks resists have a diameter "D" and an inter-structure distance/gap size "g" (which is shown here to be the surface to surface distance). The substrate is subjected to an etching in step 12 using plasma. The subsequently etched nanodisks (107) have a height "h", which depends on the etching time. Its diameter and gap size follow the same measurement as the nanodisk mask resist (105). FIG. 1(c) shows the schematic illustration of the etched nanodisk (107) with the nanodisk mask resist (105). As shown in FIG. 1(d), the residue resist mask will be subsequently removed in step 14 by etching using an acid.

EXAMPLES

Non-limiting examples of the invention and a comparative example will be further described in greater detail by reference to specific Examples, which should not be construed as in any way limiting the scope of the invention.

Example 1

Fabrication of Silicon Nanodisks on a Silicon Substrate to Obtain a Basic Colour Palette for High-Resolution Colour Printing The method of FIG. 1 is used here to form silicon nanodisks on a silicon substrate. Here, as shown in FIG. 1(a), a resist layer such as hydrogen silsesquioxane (HSQ) (Dow Corning, product number XR-1541-002) was spun coated onto a substrate (103) such as a silicon substrate to form a layer of negative electron-beam resist (101) with a thickness of 30 nm. The HSQ resist was subsequently subjected to electron beam lithography in step 10 to develop the nanodisk mask resists. The HSQ layer was subjected to a negative electron-beam exposure with an electron acceleration voltage of 100 KeV, a beam current of 500 pA and an exposure dosage of 12 mC/cm$^2$. The HSQ resist was then developed by using NaOH/NaCl salt solution (1% wt./4% wt. in de-ionized water) for 60 seconds followed by immersion in de-ionized water for another 60 seconds to stop the development.

As shown in FIG. 1(b), the developed nanodisk masks resists had a diameter "D" and an inter-structure distance/gap size "g" (which is shown here to be the surface to surface distance). The silicon substrate was subjected to etching in step 12 such as dry etching using plasma such as inductively-coupled plasma (ICP, Unaxis shuttle lock system SLR-7701-BR). During the ICP etching process, the following experimental conditions were used: the DC power was 100 watts, the coil power was 500 watts, the flow rates of chlorine ($Cl_2$) and hydrogen bromide (HBr) gases were 18 and 22 sccm (standard-cubic-centimeters-per-minute) respectively, the process pressure was 10 mtorr, and the temperature was 6° C., The silicon substrate was subjected to an etching time of 40 seconds. The subsequently etched silicon nanodisks (107) have a height "h" of 129 nm, which was measured by atomic force microscopy (AFM). Its diameter and gap size followed the same measurement as the nanodisk mask resist (105).

FIG. 1(c) shows the schematic illustration of the etched silicon nanodisk (107) with the nanodisk mask resist (105). As shown in FIG. 1(d), the residue HSQ mask was subsequently removed in step 14 by using etching in acid such as wet etching with hydrofluoric acid (Sigma Aldrich, 40-45%).

By varying the ICP etching time, different silicon nanostructures were fabricated on the silicon substrate with varying heights. It was observed that height was an important parameter to achieve vivid colour display. For example, when silicon nanodisks had a height of 70 nm, the colour palette did not show obvious vivid colours. However, when the height of the silicon nanodisk was 129 nm, a more vivid colour palette was observed. This difference was shown in FIG. 3, where the colour palette in FIG. 3(a) had more vivid colours when compared with the colour palette in FIG. 3(b).

Further, embodiments of silicon nanodisks were also fabricated by varying the nanodisk diameters from 50 nm to 180 nm, and the gap size from 10 nm to 180 nm. Referring to FIG. 2, there is shown the schematic illustration and the scanning electron micrograph (SEM) image of the fabricated silicon nanodisks (201) on a silicon substrate (203). Here, FIG. 2(a) shows the detailed schematic of a "colour pixel" made of silicon nanodisks, where the diameter, the gap size, and the height of each silicon nanodisk are denoted as D, g, and h respectively. The scanning electron micrograph (SEM) image of an embodiment of the fabricated silicon nanodisks with a diameter of 50 nm, a gap size of 20 nm and a height of 129 nm was shown in FIG. 2(b).

Further, a colour palette consolidating the various colour pixels was obtained based on the embodiments of the silicon nanodisks with the gap size varied from 10 nm to 180 nm, and the disk diameter varied from 50 nm to 180 nm. The height of the nanodisks was 129 nm. Each colour pixel had a length of 5 μm. A bright-field optical microscope image of the color palette was taken by using an optical microscope Olympus MX61 set-up (×20 air objective lens with a numerical aperture (NA) of 0.4) for the respective nanodisk gap size. As shown in FIG. 3(a), a spectrum of colours was generated and colour changes were observed along each column and row. Although the small gap size resulted in some optical coupling, the main reason for the colour change along each column of FIG. 3(a) was due to the shift of the individual resonances with an increasing diameter size of the nanodisks. Additionally, within each row, the change in colours is due to the different optical coupling for different gap sizes.

Analysis of Optical Reflectance Spectrums Obtained Experimentally and Theoretically The optical reflectance spectrum of the fabricated silicon nanodisks was obtained by using a micro-spectrometer (CRAIC UV-VIS-NIR QDI 2010) with the ×36 objective lens and a numerical aperture (NA) of 0.50, where the optical reflectance spectrum is normalized to the optical reflectance spectrum of a flat silicon substrate. Referring to FIG. 4, there is shown the optical reflectance spectrum of silicon nanodisks having a gap size of 40 nm with the optical reflectance spectrum obtained from numerical simulations using the finite-difference-time-domain (FDTD) method. Here, the relative reflectance of the colour spectrum in the $4^{th}$ column of FIG. 3(a) (denoted by the dotted lines) is compared with numerical simulations using the finite-difference time-domain (FDTD) method. FIG. 4(a) showed the experimentally obtained optical reflectance spectrum of silicon nanodisks with a gap size of 40 nm, a height of 129 nm and diameters from 50 nm to 180 nm (i.e., $4^{th}$ column of FIG. 3(a)) whereas FIG. 4(b) presents the theoretical simulations for the total reflectance of the system based on full numerical simulations using the finite-difference time-domain (FDTD) method.

As shown in FIG. 4(a), when the disk diameter was 50 nm, the optical reflectance spectrum has a "dip" on the trend line and the colour displayed was a "subtractive color". As the disk diameter increases, the "dip" feature slowly evolved into a "peak" feature, and the colour slowly became an "additive color" instead.

This result was compared with a theoretical prediction of silicon nanodisks with the same set of parameters (gap size of 40 nm, height of 129 nm, and diameters from 50 nm to 180 nm). FIG. 4(b) depicted the theoretical prediction for the total reflectance of the system obtained by numerical simulations using finite-difference time-domain (FDTD) method. It is seen that the simulations corresponds closely with the main features and the main trends that were observed experimentally.

Analysis of Excited Optical Modes in the Nanostructures at Dip or Peak Wavelength Positions To gain a deeper physical interpretation of the optical reflectance spectrum obtained in FIG. 4(a), a multi-pole decomposition approach was used to analyze the respective optical modes being excited in the nanostructures at the respective dip or peak wavelength positions. To simplify the analysis and to minimize inter-structure optical couplings, a large gap size of 180 nm was investigated. Referring to FIG. 5, there is shown the images from simulation of excited optical modes on the silicon nanodisks using the multi-pole decomposition method. FIG. 5(a) shows graphical trends of the optical spectrum of the total reflectance, the reflectance component contributed by the magnetic dipole (MD), the reflectance component contributed by the electric dipole (ED), and the reflectance component contributed by the magnetic quadrupole (MQ) in silicon nanodisks with a gap size of 180 nm and diameters varying from 100 nm to 180 nm. As shown in FIG. 5(a), the optical reflectance spectrum was superimposed with calculated scattering cross sections associated with different excited optical modes in the silicon nanodisks, namely, a magnetic dipole (MD) mode, an electrical dipole (ED) mode, and a magnetic quadrupole (MQ) mode. The nanodisk diameter was varied from 100 nm to 180 nm. By way of an example, for a silicon nanodisk with a diameter of 140 nm, there were three main optical modes being excited, namely a first-order MD mode (as indicated by (1)), a first-order ED mode (as indicated by (2)), and a second-order MD mode (as indicated by (3)). These modes were resonant at those wavelengths for which a peak in their corresponding scattering cross sections was observed. The corresponding electric/magnetic field distributions for these optical modes were shown in FIG. 5(b)-(g) at both the x-y plane and the x-z plane, respectively. FIG. 5 (b)-(g) shows the corresponding electric/magnetic field distributions for the optical modes indicated by (1), (2), (3) for silicon nanodisks with a diameter of 140 nm. FIG. 5(b) and FIG. 5(c) shows the magnetic field distributions of the first-order magnetic dipole in the x-y plane and the x-z plane. FIG. 5(d) and FIG. 5(e) shows the electric field distributions of the first-order electric dipole in the x-y plane and the x-z plane. FIG. 5(f) and FIG. 5(g) shows magnetic field distributions of the second-order magnetic dipole in the x-y plane and the x-z plane.

Moreover, as shown in FIG. 5(c), FIG. 5(e) and FIG. 5(g), the electric and magnetic field distributions at the x-z plane showed that some optical field penetrates into the silicon substrate. Based on the analysis results, it could be concluded that the main features observed in the reflection of the system (i.e., reflection dips and peaks), which were related to the observed colour pixels, spectrally coincide with the excitation of electric and magnetic resonant modes within the nanostructures. Therefore, it was possible to generate different colour pixels by controlling the spectral position and shape of these resonances (either by changing the dimensions of the nanodisks or the inter-structure distances).

Detailed theoretical analysis was conducted using full numerical simulations based on the finite-difference time-domain (FDTD) method and the multipole decomposition technique. The multipole decomposition technique allowed identification of the modes excited in the system by analyzing the currents induced within the particles. The analysis revealed that the vivid colour of silicon nanostructures on silicon substrate originated from the electric/magnetic resonances within the silicon nanostructures, and the optical coupling between neighboring silicon nanodisks.

Example 2

Analysis of Diamond Nanodisks by Scaling Based on a Refractive Index Ratio

The fabrication method and the analysis of the colour produced of silicon nano disks as described in Example 1 was applied to all other dielectric materials. The corresponding dimensions and inter-structure distances of the nanodisks for all other types of dielectric materials was calculated with reference to the fabricated silicon substrate based on a scaling factor. The scaling factor was defined as the ratio of the refractive index of silicon to the refractive index of a selected dielectric material, i.e., $n_{si}/n_{dielectric}$.

Diamond nanodisks were fabricated from a diamond substrate by simulation using the finite-difference-time-domain (FDTD) method. The corresponding diameter, height and gap size were calculated by multiplying them with the scaling factor. The refractive index of diamond ($n_{diamond}$) was 2.4 and the refractive index ratio was calculated to be 1.67. Hence, the scaling factor of 1.67 was used as the multiplicative factor to obtain the dimensions and inter-structure spacing of the diamond nanodisks based on the corresponding values from the silicon nanodisks.

Embodiments of diamond nanodisks were fabricated by varying the nanodisk diameters from 16.7 nm to 300.6 nm (by multiplying the corresponding silicon nanodisk diameters from 10 nm to 180 nm with the scaling factor of 1.67). The diamond nanodisk height was 217.1 nm (by multiplying the corresponding silicon nanodisk height of 130 nm with the scaling factor of 1.67). The gap size was set at 40 nm.

Referring to FIG. 6, the colour spectrum, optical distribution image and CIE chromaticity of diamond nanodisks (603) fabricated on a diamond substrate (601) was shown. FIG. 6(a) was a schematic illustration of diamond nanodisks (603) on a diamond substrate (601). FIG. 6(b) showed the simulated relative reflectance spectrum of diamond nanodisks with dimensions and gap size calculated by the refractive index scaling factor. FIG. 6(c) and FIG. 6(d) showed the optical distribution of the respective optical modes corresponding to the peak (as indicated by "P") and dip (as indicated by "D") features on the trend line in FIG. 6(b). FIG. 6(e) showed the colours in a CIE Chromaticity Diagram based on the simulated optical reflectance spectra (the Red, Blue, and Green spectra are indicated by "R", "B", and "G" respectively).

FIG. 6(a) illustrated the dimensions and inter-structure distance of diamond nanodisks. Accordingly, a simulated reflectance spectra of the diamond nanodisks relative to a flat diamond substrate was obtained where strong optical resonance was observed as shown in FIG. 6(b). The respective excited optical modes were shown in FIG. 6(c)-(d). Further, a CIE Chromaticity Diagram was plotted based on the data from the simulated reflectance spectra, which is depicted in FIG. 6(e). As observed in FIG. 6(e), vibrant colors could be produced with diamond nanostructures.

Example 3

Addition of an Anti-Reflectance Dielectric Layer

To improve color fidelity of the dielectric nanostructures, an anti-reflectance dielectric layer was inserted between the dielectric nanostructures and dielectric substrate. The anti-reflectance layer significantly enhances the color fidelity of the substrate. The fundamental principle of inserting this anti-reflectance dielectric layer was to minimize the background optical signal, which was not originated from the scattering of the dielectric nano structures.

In this example, the materials used for both the dielectric nanodisks and dielectric substrates were silicon. The optimal material for the anti-reflectance dielectric layer was determined by a refractive index value calculated based on $\sqrt{n_{air}n_{sub}}$, where $n_{air}$ is the refractive index of air and $n_{sub}$ is the refractive index of the base substrate. For a silicon substrate, the optimal anti-reflection dielectric layer should be close to 2.

Therefore, a possible material was $Si_3N_4$. Moreover, this anti-reflection layer was designed to have a minimum reflectance at the central wavelength at the visible regime (i.e. 550 nm) $\sqrt{n_{air}n_{sub}}$, where the corresponding optimal thickness of $Si_3N_4$ is calculated to be 60 nm. together with the corresponding thickness.

The optimal anti-reflection dielectric layer was found to be silicon nitride ($Si_3N_4$) with a thickness of 60 nm. The height and gap sizes of the silicon nanodisks were chosen to be 130 nm and 120 nm, respectively. The $Si_3N_4$ layer was deposited onto the silicon substrate by chemical vapour deposition. The deposition was carried out at a temperature of 20° C., a process pressure of 15 mTorr, and a deposition rate of 2 nm/min. The reactant gases were Silane ($SiH_4$), Nitrogen ($N_2$) and Argon (Ar). The gas flow rates were 20 sccm for $SiH_4$, 25 sccm for $N_2$, and 30 sccm for Ar.

Referring to FIG. 7, the colour spectrum and CIE chromaticity after the addition of a silicon nitride anti-reflectance layer (703) to the silicon nanodisks (705) on a silicon substrate (701) was shown. A schematic diagram to illustrate the insertion of the anti-reflectance layer was shown in FIG. 7(a) where FIG. 7(a) showed the schematic illustration of the silicon nitride anti-reflectance layer (703) as inserted between the silicon nanodisks (705) and the silicon substrate (701). Similar to examples 1 and 2, a reflectance spectrum of the dielectric nanodisk with varying diameters was obtained, as shown in FIG. 7(b) with height and gap size of 130 nm and 120 nm, respectively. The blue dot (as indicated by "B"), green dot (as indicated by "G") and red dot (as indicated by "R") were used to label the reflectance spectrum as corresponding to the best color fidelity with the blue color, green color and red color, respectively. The CIE Chromaticity Diagram based on the simulated optical reflectance spectra was presented in FIG. 7(c). It showed that the developed dielectric nanostructures were able to cover the region in the traditional "RGB" region, which was the best color fidelity for high resolution color printing beyond the diffraction limit, without the diffraction effect.

In another example, a $Si_3N_4$ layer with thickness of 70 nm was added to the silicon substrate. Silicon nanodisks were fabricated on the surface of $Si_3N_4$ layer with diameters ranging from 40 nm to 270 nm, gap sizes from 10 to 120 nm and a height of 130 nm. The various additive colour pixels were shown in FIG. 8. Each colour pixel had a length of 9 mm. FIG. 8(a) showed the bright-field optical micrograph of the colour palette. FIG. 8(c) showed the SEM image of silicon nanodisks with 60 nm of gap size and 130 nm in diameter (highlighted by the dotted line in FIG. 8(a)). The coordinates of the measured reflectance spectra of the colour palette were shown in FIG. 8(b). As shown in FIG. 8(b), the additive colours produced by the silicon nanodisks exceed the whole gamut of sRGB (standard Red Green Blue) on the CIE 1931 chromaticity diagram (occupying 120% of the sRGB gamut). From this example, it showed that the design of forming silicon nanostructures on the surface of the silicon nitride anti-reflectance layer was able to produce the best colour saturation beyond the optical diffraction limit.

INDUSTRIAL APPLICABILITY

The nano-patterns/nanostructures formed by the method of the present disclosure may be used in high-resolution colour display, optical filters, optical data storage, image sensors, optical counterfeit.

Moreover, besides the application for high-resolution colour display, the nano-patterns/nanostructures may also function as colour filters to be patterned directly on sensors, or for the structures themselves to be wavelength-selective sensors with sub-wavelength dimensions.

The nano-patterns formed by the method of the present disclosure may be used in the designs of jewelry. For example, the vibrant colours produced from diamond nanostructures can have applications to develop colourful diamond jewelries.

It will be apparent that various other modifications and adaptations of the invention will be apparent to the person skilled in the art after reading the foregoing disclosure without departing from the spirit and scope of the invention and it is intended that all such modifications and adaptations come within the scope of the appended claims.

What is claimed is:

1. A method of forming a nano-patterned substrate comprising the step of forming a plurality of nanostructures on a base substrate or on an anti-reflectance layer disposed on a base substrate, wherein the step of forming a plurality of nanostructures is by nanoimprint lithography, wet etching, dry etching, anisotropic wet etching, plasma etching, electro-beam lithography, focused ion-beam lithography-, nanosphere lithography, dip-pen nanolithography, soft lithography, chemical, electrochemical or photochemical means, wherein the base substrate comprises a dielectric material, and wherein the nanostructures are dimensioned or spaced apart from each other by a scaling factor (s) defined as a ratio of a refractive index of a silicon substrate to a refractive index of the dielectric material ($n_{si}/n_{dielectic}$), wherein $n_{si}$ is the refractive index of the silicon substrate and $n_{dielectric}$ is the refractive index of the dielectric material.

2. The method according to claim 1, wherein the nanostructures are integrally formed on the base substrate or the anti-reflectance layer disposed on a base substrate.

3. The method according to claim 1,
wherein the anti-reflectance layer has a refractive index determined by $\sqrt{n_{air}n_{sub}}$, wherein $n_{air}$ is a refractive index of air and $n_{sub}$ is a refractive index of the base substrate,
wherein the base substrate is selected from the group consisting of diamond, glass, polyethylene (PE), poly-arylene ethers (PAE), parylene, Teflon, ceramics, mica, polycarbonate (PC), polymethylniethacrylate (PMMA), polyamides, polysiloxane, polypropylene (PP), polyvinyl chloride (PVC), polyethylene terephthalate (PET) or polydimethylsiloxane (PDMS), Titanium dioxide, Gallium Nitride, Titanium Nitride, Gallium Phosphide, and Germanium, or
wherein the base substrate comprises a metal or its salt thereof, wherein the metal is selected from the group consisting of Germanium, Titanium, Indium, Gallium, Tin, Lead, Antimony, Bismuth, Lithium, Rubidium, Barium, Zirconium, Tungsten, and Tantalum.

4. The method according to claim 3, wherein the anti-reflectance layer has a thickness of about 50 nm to about 100 nm.

5. The method according to claim 1, wherein each of the nanostructures is a protrusion, recession, or dimple.

6. The method according to claim 1, wherein dimensions and positions of the nanostructures comprises lateral dimensions, vertical dimensions, inter-structure distance, or any combinations thereof.

7. The method according to claim 1, wherein each of the nanostructures has a geometrical shape selected from the group consisting of disks, tubes, wires, columns, cylinders, pyramidal, conical, rings, and rectangular prisms.

8. The method according to claim 1, wherein the dielectric material is selected from the group consisting of diamond, glass, polyethylene (PE), poly-arylene ethers (PAE), parylene, Teflon, ceramics, mica, polycarbonate (PC), polymethylmethacrylate (PMMA), polyamides, polysiloxane, polypropylene (PP), polyvinyl chloride (PVC), polyethylene terephthalate (PET) or polydimethylsiloxane (PDMS), Titanium dioxide, Gallium Nitride, Titanium Nitride, Gallium Phosphide, and Germanium.

9. The method according to claim 1, wherein the base substrate comprises a metal or its salt thereof, wherein the metal is selected from the group consisting of Germanium, Titanium, Indium, Gallium, Tin, Lead, Antimony, Bismuth, Lithium, Rubidium, Barium, Zirconium, Tungsten, and Tantalum.

10. The method of claim 1, wherein the scaling factor (s) is used as a multiplicative factor to determine dimension(s) or inter-structure spacing value of the plurality of nanostructures as compared to silicon nanostructures.

11. The method of claim 10, wherein the silicon nanostructures have dimensions of x diameter, z height, with an inter-structure spacing of v, and the nanostructures have dimensions of (s×x) diameter, (s×z) height, and with an inter-structure spacing of (s×v).

12. The method of claim 1, wherein each nanostructure has a diameter of about 10 nm to about 320 nm.

13. The method of claim 1, wherein each nanostructure has an inter-structure distance between two adjacent nanostructures of about 10 nm to about 180 nat.

14. The method of claim 1, wherein each nanostructure has a height of about 160 nm to about 260 nm.

15. A method of forming a nano-patterned substrate comprising the step of forming a plurality of nanostructures on a base substrate or on an anti-reflectance layer disposed on a base substrate,
wherein the step of forming a plurality of nanostructures is by nanoimprint lithography, wet etching, dry etching, anisotropic wet etching, plasma etching, electro-beam lithography, focused ion-beam lithography, nanosphere lithography, dip-pen nanolithography, soft lithography, chemical, electrochemical or photochemical means,
wherein the base substrate comprises a dielectric material,
wherein the nanostructures are of the same material as the base substrate, and
wherein the nanostructures are dimensioned or spaced apart from each other by a scaling factor (s) defined as a ratio of a refractive index of a silicon substrate to a refractive index of the dielectric material ($n_{si}/n_{dielectric}$), wherein $n_{si}$ is the refractive index of the silicon substrate and $n_{dielectric}$ is the refractive index of the dielectric material.

16. The method of claim 15, wherein the scaling factor (s) is used as a multiplicative factor to determine dimension(s) or inter-structure spacing valued of the plurality of nanostructures as compared to silicon nanostructures.

17. The method of claim 15, wherein each nanostructure has a diameter of about 10 nm to about 320 nm, a height of about 160 nm to about 260 nm, and an inter-structure distance between two adjacent nanostructures of about 10 nm to about 180 nm.

18. A method of forming a nano-patterned substrate comprising the step of forming a plurality of nanostructures on a base substrate or on an anti-reflectance layer disposed on a base substrate,
wherein the step of forming a plurality of nanostructures is by nanoimprint lithography, wet etching, thy etching, anisotropic wet etching, plasma etching, electro-beam lithography, focused ion-beam lithography, nanosphere lithography, dip-pen nanolithography, soft lithography, chemical, electrochemical or photochemical means,
wherein the base substrate comprises a dielectric material,
wherein the nanostructures are of the same material as the base substrate,
wherein the nanostructures are dimensioned or spaced apart from each other by a scaling factor (s) defined as a ratio of a refractive index of a silicon substrate to a refractive index of the dielectric material ($n_{si}/n_{dielectric}$), wherein $n_{si}$ is the refractive index of the silicon substrate and $n_{electric}$ is the refractive index of the dielectric material, and the scaling factor is used as a multiplicative factor to determine dimension(s) or inter-structure spacing value Li of the plurality of nanostructures as compared to silicon nanostructures with dimensions of x diameter, z height, with an inter-structure spacing of v, and wherein each of the nanostructures has dimensions of (s×x) diameter, (s×z) height, and with an inter-structure spacing of (s×v).

\* \* \* \* \*

UNITED STATES PATENT AND TRADEMARK OFFICE
CERTIFICATE OF CORRECTION

| | | |
|---|---|---|
| PATENT NO. | : 11,287,551 B2 | Page 1 of 1 |
| APPLICATION NO. | : 16/330764 | |
| DATED | : March 29, 2022 | |
| INVENTOR(S) | : Kwang Wei Joel Yang et al. | |

It is certified that error appears in the above-identified patent and that said Letters Patent is hereby corrected as shown below:

In the Claims

| Column | Line(s) | |
|---|---|---|
| 18 | 51 | Delete "thy" and insert --dry-- |

Signed and Sealed this
Twenty-seventh Day of June, 2023

Katherine Kelly Vidal
*Director of the United States Patent and Trademark Office*